United States Patent
Carlini et al.

(10) Patent No.: US 6,844,732 B2
(45) Date of Patent: Jan. 18, 2005

(54) METHOD AND DEVICE FOR COMPENSATING FOR MAGNETIC NOISE FIELDS IN SPATIAL VOLUMES, AND NUCLEAR MAGNETIC RESONANCE IMAGING APPARATUS

(75) Inventors: Davide Carlini, Genoa (IT); Alessandro Carrozzi, LaSpezia (IT); Aldo Ginanneschi, Genoa (IT); Paolo Iaia, Genoa (IT)

(73) Assignee: Esaote S.p.A., Casale Monferrato (IT)

( * ) Notice: Subject to any disclaimer, the term of this patent is extended or adjusted under 35 U.S.C. 154(b) by 0 days.

(21) Appl. No.: 10/409,061

(22) Filed: Apr. 9, 2003

(65) Prior Publication Data

US 2003/0214296 A1 Nov. 20, 2003

(30) Foreign Application Priority Data

Apr. 9, 2002 (IT) .................................... SV2002A0014

(51) Int. Cl.⁷ ................................................ G01V 3/00
(52) U.S. Cl. ...................................... 324/318; 324/319
(58) Field of Search ................................ 324/318, 319, 324/322, 309, 307, 313, 301

(56) References Cited

U.S. PATENT DOCUMENTS

| | | | | |
|---|---|---|---|---|
| 4,665,368 A | * | 5/1987 | Sugiyama et al. | 324/318 |
| 5,214,383 A | * | 5/1993 | Perlmutter et al. | 324/313 |
| 5,245,286 A | * | 9/1993 | Carlson et al. | 324/319 |
| 5,278,503 A | * | 1/1994 | Keller et al. | 324/318 |
| 5,463,318 A | * | 10/1995 | Duret | 324/301 |
| 5,578,920 A | * | 11/1996 | Kuster et al. | 324/301 |

FOREIGN PATENT DOCUMENTS

| | | |
|---|---|---|
| DE | 197 02 831 A1 | 3/1998 |
| EP | 0 445 960 A1 | 9/1991 |
| EP | 0 692 721 A1 | 1/1996 |
| EP | 0 899 576 A1 * | 7/1998 |
| EP | 0 899 576 A1 | 3/1999 |
| WO | 92/18873 | 10/1992 |

* cited by examiner

Primary Examiner—Brij B. Shrivastav
(74) Attorney, Agent, or Firm—Burns, Doane, Swecker & Mathis, L.L.P.

(57) ABSTRACT

A method for compensating for magnetic noise fields in spatial volumes includes determining the strength of a magnetic field outside said spatial volume; defining the correlation between the noise field outside the spatial volume and the corresponding noise field inside said spatial volume; generating a magnetic compensation field for neutralizing the noise field in said spatial volume. The method further provides separate detection of noise fields with frequencies in the range of at least two different frequency bands.

72 Claims, 5 Drawing Sheets

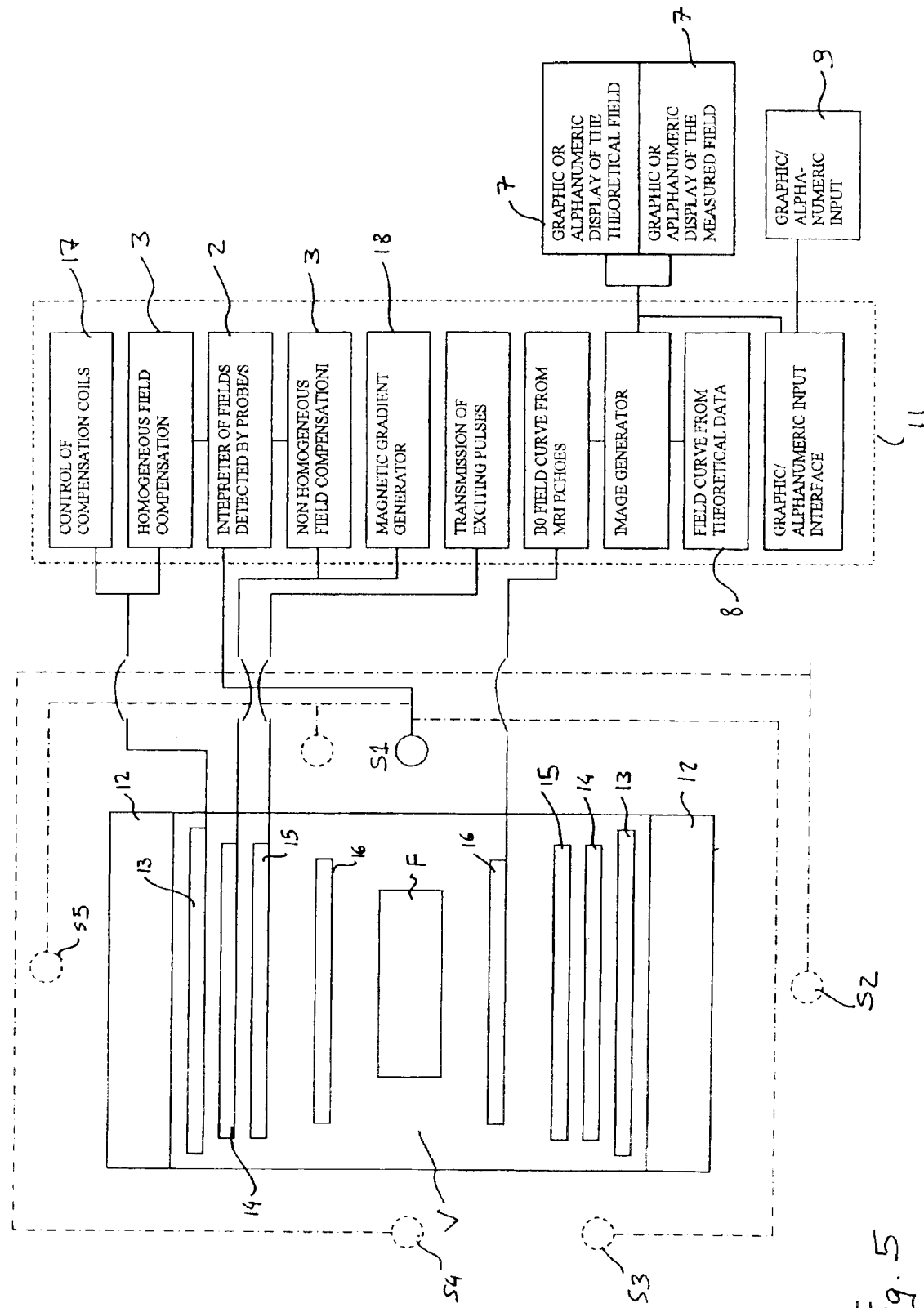

METHOD AND DEVICE FOR COMPENSATING FOR MAGNETIC NOISE FIELDS IN SPATIAL VOLUMES, AND NUCLEAR MAGNETIC RESONANCE IMAGING APPARATUS

CROSS-REFERENCE TO RELATED APPLICATIONS

This application claims priority under 35 U.S.C. §§ 119 to SV2002A000014 filed in Italy on Apr. 9, 2002; the entire content of which is hereby incorporated by reference

BACKGROUND OF THE INVENTION

1. Field of the Invention

The invention relates to a method for compensating for magnetic noise fields in spatial volumes.

2. Description of the Related Art

In the following description and claims, "noise fields" shall be intended as magnetic field fluctuations induced in a spatial volume, particularly the imaging cavity of Magnetic Resonance imaging apparatuses, which fluctuations are caused by magnetic fields outside said spatial volume or the imaging cavity of the MRI apparatus.

Currently, the wide use of electric power causes the generation of considerable magnetic fields, which pervade the environment. These magnetic fields may have considerable strengths and affect or alter the operation of electric or electronic equipment which use magnetic fields. Such equipment may be of any type, e.g., measuring instruments, diagnostic or therapeutic imaging apparatuses, and the like.

Currently, the above noise may be caused by different types of magnetic fields, which are differentiated on the basis of frequency. A first so-called low-frequency type includes magnetic fields with frequencies ranging from less than 1 Hz to a few units of Hz. These types of low-frequency noise fields are typically generated by the passage of vehicles or the like. Each vehicle generates, in first approximation, a magnetic dipole with a predetermined strength and a predetermined position and the dipoles are oriented in the direction of the earth's magnetic field flow lines.

A second type includes noise fields generated by sources of mains AC, which have frequencies of about 50 to 60 Hz. Besides home or static sources, electric vehicles shall be also considered, such as trains, tramcars, subway trains, trolley-buses, etc., due to the considerable powers absorbed and the strengths of the fields generated thereby.

A third category might include noise fields with frequencies of the order of a fraction of the main AC frequency, i.e., of about 10 to 20 Hz. Particularly, some railway electrification lines use, for instance, one-third of the main AC frequency, that is a frequency of the order of 16 Hz.

Other noise fields consist of fast, i.e., high-frequency transients. In spatial volumes containing significant electrically conductive masses, e.g., shielding magnetic structures or Faraday cages, these fast transients induce noise currents, which modify the noise fields inside the imaging cavity. These fast magnetic field transients may be also combined with other noise types.

Currently, the methods of compensation for magnetic fields like the ones described hereinbefore use a single sensor and jointly compensate the fields with different frequencies. Joint processing extends from the detection of noise fields, through the generation of compensation fields, to the calculation of the noise fields generated inside the spatial volume, based on the results of measurements outside the spatial volume.

OBJECTS AND SUMMARY

The invention has a purpose of improving prior art methods to obtain a better and more accurate noise field compensation.

One embodiment of the invention achieves the above purpose by providing a method which:

determines the strength of a magnetic field outside a spatial volume;

defines, on a theoretical basis, i.e., according to the laws of electromagnetism, or on an empirical basis, a correlation between the noise field outside the spatial volume and the corresponding noise field inside the spatial volume, or calculating the noise field inside the spatial volume, from the measurements of the magnetic field outside the spatial volume; and from the inside magnetic field, as determined theoretically or empirically, generates a magnetic compensation field, particularly for neutralizing the noise field in said spatial volume.

The method further provides separate detection of noise fields having frequencies in the range of at least two predetermined frequency bands, or three or more different frequency bands, and the determination and/or generation of the corresponding compensation fields for all or at least some of the noise fields, with frequencies in the range of at least two, three or more predetermined frequency bands.

This may be obtained by using, for at least some of the noise fields with frequencies in the range of the at least two, three or more frequency bands, the same correlation law to correlate the parameters of the outside noise field/s to the inside noise field/s, or the same correlation law to calculate the magnetic noise fields inside the spatial volume, based on the measurement/s of the noise fields outside the spatial volume and/or the same means for generating the corresponding compensation fields for at least some of the magnetic noise fields with frequencies in the range of the at least two, three or more different frequency bands.

Alternately, laws may be provided for correlating the noise fields detected outside the spatial volume and the corresponding noise fields inside the spatial volume, which are different for each of the at least two, three or more frequency bands provided for discriminating the different types of noise fields or which are different for at least some of the at least two, three or more discriminating frequency bands.

As an alternative to or in combination with the above, means may be also provided for generating magnetic compensation fields which are different for all or at least some of the at least two, three or more frequency bands that are used to discriminate the different noise field types.

Again, as an alternative to or in combination with the above, at least one common detection probe may be provided for detecting the noise field/s with frequencies in the range of all or at least some of the at least two, three or more frequency bands or at least one different probe may be provided for the noise fields with frequencies in the range of all of the at least two, three or more discriminating frequency bands.

Because of the above, a compensation field may be selectively generated for any type of noise field frequency, thereby optimizing the detection of the noise field, the correlation law to relate the noise field detected outside the spatial volume and the noise field inside it, and the means for generating the compensation fields.

Furthermore, a considerable advantage is also achieved in terms of construction costs. In fact, while embodiments of the invention require more expensive hardware, nevertheless, by separating the hardware into sections corresponding to the different frequency ranges, simple and inexpensive units may be used, such as variable gain amplifiers, which operate and are only meant to have an optimized performance in narrow frequency bands.

A closer analysis of the noise fields shows that the latter can have several different degrees of freedom, i.e., different variable parameters, whereby the distribution of the noise field inside the spatial volume may be determined by using systems of equations based on the laws of electromagnetism which allow to determine all the parameters. Typically, for instance, with reference to noise fields that may be associated with dipoles by an approximation to the linear field describing coefficients, these dipoles have fixed orientations, i.e., are parallel to the earth's magnetic field. All dipole strength and position parameters are free. In this case, if the field is measured by using two probes disposed in different locations, a system of two equations may be generated, which allows an accurate determination of the two above mentioned parameters.

In accordance with an additional advantageous characteristic, an embodiment of the invention also includes the steps of defining the degrees of freedom, i.e., the variable parameters of the individual noise fields, and of measuring the noise fields at a number of different locations, outside the spatial volume, which number corresponds to the number of degrees of freedom or variable parameters, a system of equations being generated on the basis of these different measurements, which equations have a number of functions for correlation with the field inside the spatial volume, which number is equal to that of the measurements, and whose solution allows to determine all the variable parameters of the magnetic noise fields.

Yet another embodiment of the inventive method consists in also providing, alternatively to or in combination with the above, an empirical method for determining the functions for correlation between the noise fields outside the spatial volume and the noise fields inside it, hence a more accurate determination of the magnetic compensation fields.

This additional embodiment includes the following steps:
  generating a static magnetic field in the spatial volume, which magnetic field has such a strength and homogeneity as to be suitable for Magnetic Resonance imaging;
  introducing a phantom in said static magnetic field, whose response to nuclear spin echo excitation is known;
  exciting nuclear spin echoes in said phantom;
  receiving nuclear spin echoes from said phantom when fields are provided for compensating for the noise fields in the spatial volume;
  comparing actually received data with well-known data;
  adjusting the parameters of the functions that are used to calculate or correlate noise fields outside the spatial volume and noise fields inside the spatial volume, on the basis of the differences obtained by the above comparison, and in such a manner as to neutralize or minimize said differences.

This additional embodiment allows to further improve the compensation accuracy and to empirically adjust the functions for calculation or correlation between outside noise fields and inside noise fields.

In first approximation, the frequency response of nuclear spin echoes is analyzed, and the discrepancy between the detected frequency and the theoretical well-known phantom frequency response is used to adjust the parameters of the correlation or calculation functions, particularly, the gain of compensation field generators.

According to another embodiment, the comparison results may be displayed in graphic form on a monitor, graphic means being provided to adjust the displayed representation, which means automatically generate controls for correcting the parameters of the calculation or correlation functions, corresponding to graphic changes.

An additional embodiment of the inventive method consists in the provision of the following steps:
  performing multiple noise field detections in time;
  determining the maximum amplitude range of the noise fields, by determining, in a given time, the maximum and minimum values of the noise field curve;
  determining the compensation field from the measured noise field, by subtracting therefrom the offset or average compensation field value, which is calculated from the detected noise field; and
  generating the compensation field so determined.

The above is a kind of automatic offset, which allows to reduce the power requirements of compensation field generation. In fact, in most applications, the simple presence of an outside static magnetic field does not cause noise or operational problems, and only time dependent components cause considerable operational failures. Hence, compensation field generation shall only account for the time dependent component of the noise field. In graphic form, the above steps substantially consist in displacing a wave-like curve, which describes the field fluctuations caused by the noise field, so that these oscillations are deemed to occur close to a line having a zero value.

Regarding the compensation for noise fields comprising of fast transients, which are altered by currents induced in electrically conductive structures, contained in the volume of interest, said compensation is performed by providing an exponential distribution for these high-frequency fields, whereby compensation field generating currents are created which have a substantially inverse exponential curve. These currents are superimposed on the currents for generating compensation fields for low-frequency noise field types, and provide a sort of "overshoot" for the currents for generating noise field compensating fields.

Another embodiment of the invention also relates to a device for compensating for magnetic noise fields in a spatial volume, which device comprises:
  at least one noise field detecting probe, which is disposed outside a spatial volume;
  a computer unit for determining the magnetic fields inside the spatial volume, on the basis of probe data and of empirically defined or theoretically electrodynamics-based calculation or correlation functions; and
  a unit for generating the magnetic compensation fields for the noise fields inside the spatial volume.

According to the invention, this embodiment includes means for defining at least one separating frequency to discriminate two bands of noise fields, and means for determining the corresponding magnetic fields inside the spatial volume and/or means for generating the corresponding compensation fields, which are different for the noise fields of said two frequency bands.

In accordance with another embodiment, a set of filters may be provided, whose passband is such as to divide a frequency range into at least two different frequency bands or into three or more frequency bands.

Separate and different means for calculating the magnetic noise fields inside the relevant volume, operating with different functions, may be provided for each frequency band of the magnetic noise fields or for subsets of frequency bands.

Alternatively to, or in combination with the above, separate and different means for generating compensation fields may be provided for each frequency band or for subsets of frequency bands.

The embodiment may have a single probe outside the spatial volume, which is connected to a single computer unit for determining the noise field inside the spatial volume and to a single unit for generating the compensation field.

Particularly, the embodiment may have a single probe outside the spatial volume, which is connected to a single computer unit for determining the noise field inside the spatial volume and to a plurality of generator units for generating compensation fields for the different frequencies according to the at least two, three or more predetermined noise field frequency bands, the probe being used in succession for detecting noise fields with frequencies in the range of the at least two, three or more predetermined frequency bands, there being provided variable passband filtering means, or different filters with different passbands, for alternate connection to the probe, and the computer unit for determining the noise fields inside the spatial volume being programmable and provided with a storage unit containing the different functions for calculation of noise fields inside the spatial volume, on the basis of the noise fields detected by the probe outside the spatial volume, and for correlation between the noise fields outside the spatial volume and the corresponding fields inside the spatial volume, whereas the algorithms corresponding to said inside field calculation and correlation functions, depending on the operating passband filter, are loaded and executed in the working storage, and the data of the so determined inside noise field is transmitted to a compensation field generator, dedicated to the corresponding frequency band.

In accordance with another embodiment, the device may have multiple permanent probes, each dedicated to the detection of noise fields outside the spatial volume, with frequencies in the range of one of the predetermined frequency bands or a subset of the predetermined frequency bands, a unit for calculation or correlation of inside noise fields for each predetermined frequency band or subset of predetermined frequency bands, as well as a compensation field generator unit for each frequency band or each subset of frequency bands.

The compensation field generating units include an electronic unit which generates a current to operate one or more magnetic field generating coils, such as solenoids or the like, although a single compensation field generating coil may be provided, which is or may be connected to the different units for generating compensation field exciting currents for the noise fields with frequencies in the range of the at least two, three or more predetermined frequency bands.

A compensation field generating coil may be provided for each separate unit that generates the compensation field exciting currents, which is associated with one of the at least two, three or more predetermined frequency bands or to a subset of said at least two, three or more frequency bands.

Another embodiment of the device consists in that the device has at least two, three or more probes, positioned outside the spatial volume in different locations, and each designed to detect the noise field outside said spatial volume at the different probe locations, with frequencies in the range of at least one frequency band of the at least two, three or more predetermined bands, an algorithm being loaded in the computer and correlation unit, for generating and solving a field describing system of equations, each equation consisting of the calculation or correlation equation applied to the data detected by one of said at least two, three or more probes, which solution of the system of equations provides all the field describing variable parameters contained in said calculation and correlation functions.

According to yet another embodiment, the device is provided in combination with internal probes which measure the field inside the spatial volume, there being provided means for comparing the noise fields inside the spatial volume which are obtained by a calculation based on measured outside fields, and the fields inside the spatial volume which are measured by the internal probes, as well as means for manually adjusting the parameters of the calculation and correlation functions to minimize the differences between the calculated inside fields and the actually measured inside fields.

Advantageously, the probes situated inside the spatial volume are active probes, i.e., generate a predetermined test field, whose characteristics are well-known and predetermined in a no-noise condition, while the comparator receives the measurements of said inside test field and the nominal known values of said test field and there being provided means for manually adjusting the parameters of the calculation and correlation functions to minimize the differences between the known test field data and actual test field measurement data.

As a further embodiment of the use of the test field and of the probes for measuring it, a device is provided for exciting and detecting Magnetic Resonance echoes in a predetermined phantom.

This device includes means for generating a static field inside a predetermined volume, a coil for transmitting nuclear spin exciting pulses, a coil for receiving echoes from said nuclear spins, and a phantom having well-known response characteristics related to said Magnetic Resonance echoes, means for determining the frequency of said Magnetic Resonance echoes and means for comparing said Magnetic resonance echo frequency with the well-known frequency, means for adjusting the parameters of the calculation or correlation function/s and/or of the compensation field generators, to minimize or neutralize the difference resulting from the comparator output.

Particularly, the frequency of Magnetic Resonance echoes is detected and compared with the well-known frequency, the parameters of the calculation and correlation functions and/or the compensation field generating currents being adjusted to neutralize or minimize this frequency difference.

The parameters of calculation or correlation functions and/or of compensation field exciting current generation may be adjusted automatically by means of feedback units, which adjust the parameters of calculation or correlation functions and/or the characteristics of the compensation field generating current on the basis of the difference signal resulting from the comparator.

A manual adjustment may be also made by using input means, through which controls may be input for adjusting the parameters of the calculation or correlation functions and/or the compensation field generating currents.

According to an advantageous embodiment, the device has means for displaying the parameters or the curve of the test field and/or the outside noise fields and/or both theoretical or known and actual or measured inside fields, in alternate, overlapped and/or tiled form, graphic interface means of graphic input means through which controls are input, which change the aspect of the magnetic fields and/or the parameters thereof and means for univocal association of a change to the parameters of the calculation and correlation functions and/or to the compensation field generating currents in response to the selected graphic changes.

It shall be noted that the means and units of the device may be units with a dedicated construction or computers, as well as small suitably programmed PCs, having interfaces for connection with the outside noise field and/or inside noise field measuring probes, and with the compensation field generating coils and/or with the test field generating and measuring devices, while the software for executing probe signal reading functions, calculation and correlation functions to determine inside noise fields, current generating functions to create compensation field generating currents, comparison functions, functions for automatic determination or manual setting of adjustments to the parameters of calculation and correlation functions and/or to compensation field exciting current generation functions, as well as the software for displaying and controlling the alphanumeric and graphic manual data input interfaces is loaded in said computer or PC.

Referring now to a particular embodiment of the field compensation device, the latter is provided in combination with a Magnetic Resonance imaging apparatus, said apparatus being situated in a delimited space, which forms the spatial volume in which the noise fields are to be compensated, and the Magnetic Resonance apparatus being used as an internal probe for detecting the conditions of the magnetic field inside said space based on the changes made to a well-known static field.

The Magnetic Resonance imaging machine includes all the components of an active probe, i.e., means for generating a static test field, coils for transmitting exciting pulses, coils for receiving nuclear spin echoes, an electronic unit for processing the received nuclear spin echo signals and electronic units that can be programmed in such a manner as to execute the comparison between the static field characteristics derived from nuclear spin echo receiving signals and the known characteristics of the static field, by simply providing a test phantom and a difference signal output interface with the noise field compensation device.

Here, since Magnetic Resonance imaging apparatuses are provided with display means, the graphic processing and display section of said apparatus may be used to display the curve of the test magnetic field as obtained by actual measurement, and that associated with known and predetermined characteristics, and to make appropriate adjustments aimed at minimizing or neutralizing the differences between the actual test field and the test field having those known and predetermined characteristics, i.e., the nominal test field, the data of said adjustments being transmitted through a special transformation interface, which transforms them into control signals, to be transmitted to the noise field compensation device.

An embodiment of the invention also relates to a Magnetic Resonance imaging machine including a cavity for accommodating a body under examination or a part thereof, means for generating a static field which permeates said cavity, at least one exciting pulse transmitting coil, at least one nuclear spin echo receiving coil, at least one compensation coil and at least one gradient coil, and there being provided an electronic apparatus controlling unit to operate the transmitting coil, the compensation coil and the gradient coils and which receives nuclear spin echo signals from the receiving coil, processes them and displays the corresponding images.

According to this embodiment, the apparatus incorporates a noise field compensation device inside the cavity wherein the body under examination or a part thereof is accommodated, there being provided at least one probe for detecting the noise fields outside the cavity, means for determining said noise fields inside the cavity on the basis of external measurement/s by executing theoretically or empirically defined calculation or correlation functions, means for generating compensation fields for inside noise fields.

The above means may be separate units, different from the specific control and processing units of the Magnetic Resonance imaging apparatus, or some or all of them may be existing units of the Nuclear Magnetic imaging apparatus.

For instance, according to a first embodiment, the compensation field generator means are made of the compensation coil/s and/or by the gradient coil/s.

The use of gradient coils may be advantageous for compensating for noise fields which cause field nonhomogeneities inside the imaging cavity of the Magnetic Resonance imaging apparatus. It shall be noted that this is indeed possible thanks to the fact that the compensation device is closely integrated in the Magnetic Resonance imaging apparatus. This close integration, whereby almost all the components of the compensation device, except the probes, are existing units of the Magnetic Resonance imaging apparatus, allows to operate and control even the gradient coils, with no expensive construction requirement, by setting the gradient field in such a manner as to compensate for any noise field induced non homogeneity.

Also, when the apparatus has a programmable control and processing unit, all the means of the noise field compensation device are the electronic units of the Magnetic Resonance imaging apparatus, in combination with software for executing noise field and compensation field measurement and determination functions.

Particularly, the Magnetic Resonance imaging apparatus has an input for at least one probe, preferably for at least two, three or more probes, for detecting fields outside the cavity of the apparatus itself, and units for interfacing these probes with the control and processing unit of the apparatus, while a program for executing the compensation procedure is loaded, which determines, by using preset calculation and correlation functions, the inside noise fields and the compensation and/or gradient coil exciting current, to be superimposed on the currents for generating normal compensation and gradient fields to obtain noise field compensation fields.

As disclosed above regarding the method and device, the Magnetic Resonance imaging apparatus may include an interface for connection with one or more probes, which interface has means for setting frequency thresholds, to determine at least two different frequency bands of noise fields or filters having a passband that may be or is set on different frequency bands for separate measurement of noise fields having different frequencies.

In this case, the apparatus may have individual hardware units or specific software programs loaded in the control and processing unit thereof, separate computer units for determining the inside noise fields, by using optimized calculation or correlation functions for each frequency band of the at least two available frequency bands.

Similarly, the apparatus may have individual hardware units or specific software programs loaded in the control and processing unit thereof, separate units for generating compensation fields for the in-cavity noise fields, for each frequency band of the at least two available frequency bands.

Still as described above for the noise field compensation device, the separate units for generating the compensation fields for the inside noise fields for each frequency band of the at least two frequency bands being used may comprise of a single generator unit which generates currents for exciting a single compensation coil, or multiple separate generator units for each frequency band in use, which operate compensation field generating coils, individually or in separate sets.

The above shows that the generator units in the Magnetic Resonance imaging apparatus, which generate currents for exciting substantially homogeneous compensation fields inside the imaging cavity of the apparatus, operate the static field compensation coils of the apparatus, whereas the generator units which generate currents for exciting compensation fields for non homogeneous noise fields in said imaging cavity modulate the currents for exciting one or more gradients provided to the gradient coils of the Magnetic Resonance imaging apparatus as soon as these magnetic gradients are operated.

According to another embodiment, the Magnetic Resonance imaging apparatus also has means for measuring the actual magnetic field inside the cavity, which comprise the static field generators, the exciting pulse transmitting coils, the nuclear spin echo receiving coils, as well as the control and processing unit of the apparatus itself, there being provided a phantom to be accommodated in the cavity of the apparatus and a software program for measuring the actual field in the cavity, which program is loaded in and may be executed by the control and processing unit, and includes the steps of transmitting exciting pulses to the phantom in the cavity, receiving nuclear spin echoes from the phantom, determining the field curve inside the cavity from the received echoes, and comparing the received echo frequency and/or the actual inside field curve with the nominally or theoretically expected echo frequency and/or with the nominal or theoretically expected static field curve.

As described above with reference to the noise field compensation method and device, by using dedicated hardware processing units or appropriate software programs loaded in the control and processing unit of the Magnetic Resonance imaging apparatus, the comparison result may be automatically processed by the dedicated hardware units or by the processing unit of the apparatus, and transformed into signals for correcting the inside noise field calculation functions on the basis of the detections performed by the probe/s outside the cavity and/or into signals for correcting the compensation field/s exciting currents. Hence, the full integration of the noise field compensation device with the Magnetic Resonance imaging apparatus further allows compensation to be effected in a fully automatic manner, i.e., no intervention is required from the user.

Obviously, a semimanual or manual mode may be always set.

In this case, the comparison result may be displayed graphically, e.g., on a display, and manual input means may be provided to input correction parameters either alphanumerically and through graphic devices for adjusting the actual curve of the displayed field, which parameters are interpreted by the apparatus and transformed into appropriate control signals, there being provided dedicated hardware units or suitable software programs in the control and processing unit of the Magnetic Resonance imaging apparatus.

As is apparent from the above description relating to the Magnetic Resonance imaging apparatus, the noise field compensation device integrated therein may have all the characteristics and combinations or sub-combinations of characteristics as provided for the noise field compensation device which forms a self-standing and independent operating unit. It is apparent that this integration in the Magnetic Resonance imaging apparatus allows to reduce construction costs for the device, the individual operating units of the device being included in the Magnetic Resonance imaging apparatus and the different features required for noise field compensation being executable by suitable software for managing the control and processing operating units resident in the apparatus, according to the functional requirements of the noise field compensation method in use.

In fact, when the noise field compensation device is integrated in the Magnetic Resonance imaging apparatus, considerable savings on the total cost of the two devices are obtained, in addition to important functional advantages.

Further, according to another embodiment, full integration of the noise field detection and compensation device in the Magnetic Resonance imaging apparatus allows the use of a particular Magnetic Resonance imaging method. In addition to the normal known steps of Magnetic Resonance imaging and image reconstruction from imaging data, this method includes the further following steps:

measuring noise fields before executing imaging steps; and calculating compensation fields and exciting currents before executing imaging steps;

generating compensation fields during the whole Magnetic Resonance imaging time.

Possibly, a compensation check step may be provided at the end of the Magnetic Resonance imaging sequence.

Such a check step may be executed alternatively to or in combination with, other compensation field checking steps, even immediately before or immediately after compensation field generation, e.g., by using, as described above, the Magnetic Resonance imaging apparatus as a magnetic field sensor in the imaging cavity.

Particularly, the Nuclear Magnetic Resonance imaging method includes the following steps:

setting parameters for correlation and/or calculation of noise fields inside the imaging cavity, based on the noise fields detected outside said cavity;

measuring the actual magnetic field inside the cavity while the compensation fields are active, and correcting the correlation and/or calculation functions for the noise field inside the cavity and the compensation fields, based on the comparison between the nominal and/or theoretical value of the inside field and the actual field obtained by said measurement, immediately before the imaging steps;

activating the compensation fields based on outside noise field measurements and on the inside field correlation and/or calculation functions as corrected during the preceding step;

executing substantially simultaneous nuclear spin echo signal excitation and detection steps in compliance with Magnetic Resonance imaging modes;

reconstructing images from these received signals; and repeating, if needed, the noise field compensation and imaging steps.

In combination with the above steps, an additional measurement step may be provided to determine the actual in-cavity field, when the compensation fields are active and the inside noise field correlation or calculation functions have been corrected and/or the compensation field is generated by comparing the actual measured value and the nominal, theoretical value of this in-cavity field, even when the Magnetic Resonance imaging steps have been executed.

Particularly, when a succession of Magnetic Resonance imaging operations are executed, it is possible to interpose, between individual sequences of imaging steps leading to successive images, a step in which the actual magnetic field is measured inside the imaging cavity, and the correlation or calculation functions for the outside noise field and the inside noise field are corrected, and/or the compensation field for the inside noise field is generated.

The compensation for the noise generated by fast transients, by equating them with exponential curve fields and the determination of inverse compensation field generating currents, allows the use of the units contained in the above device, by suitably programming these existing units or replicating them, if a dedicated or separated treatment is needed.

The characteristics of the invention and the advantages derived therefrom will appear more clearly from the following description of a few nonlimiting embodiments, illustrated in the annexed drawings, in which:

FIG. 5 shows a block diagram of a Magnetic Resonance imaging apparatus, which integrates a noise field compensation device according to the invention.

DETAILED DESCRIPTION OF THE PREFERRED EMBODIMENTS

Figure 1:
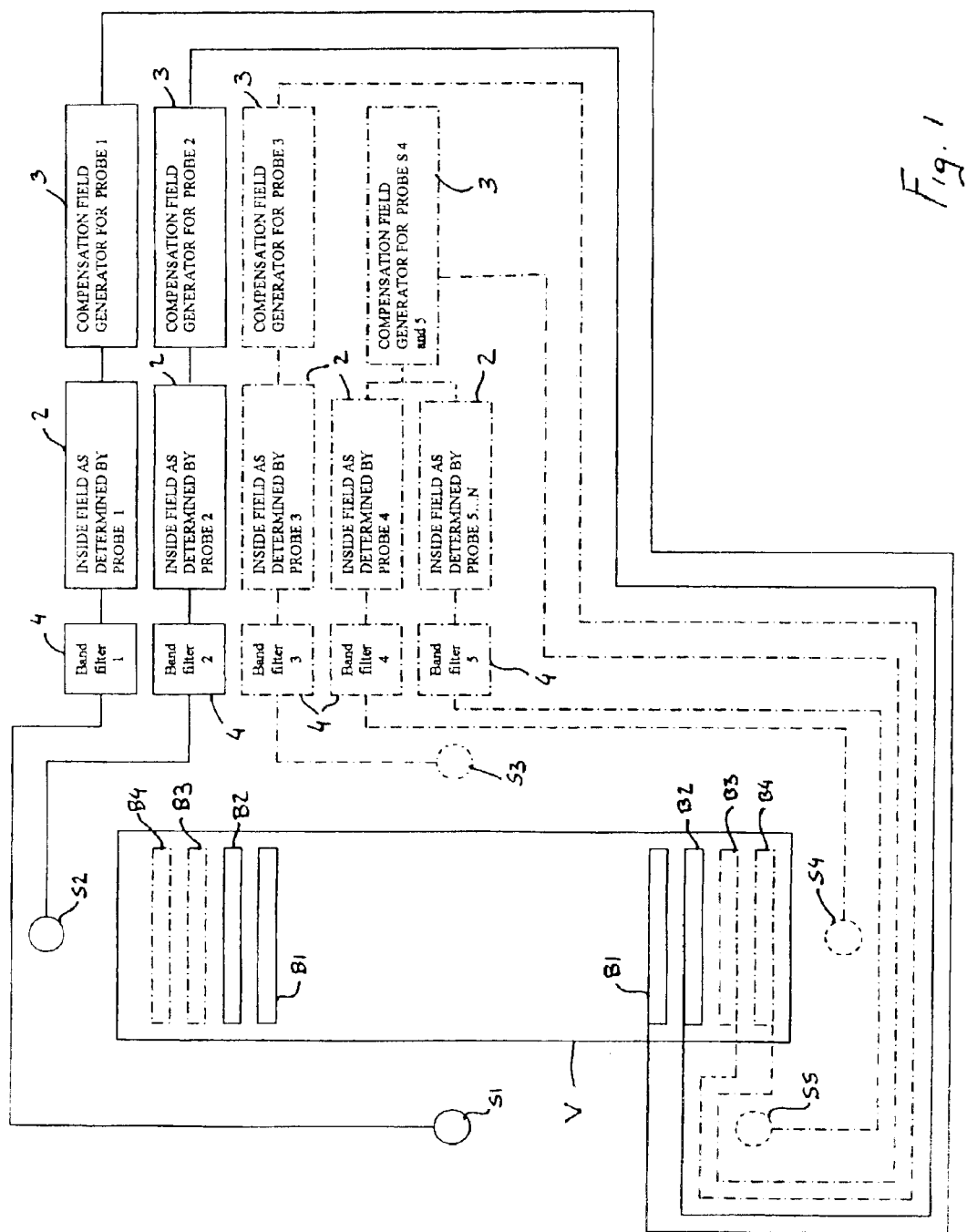
FIG. 1 shows a simplified block diagram of a first embodiment of the apparatus according to the invention.

Referring to FIG. 1, a device for compensating for magnetic noise fields in a spatial volume V has at least one probe S1 for measuring noise fields, which is disposed outside the spatial volume V.

The probe S1 may be of any type, such as a small Hall probe or a small coil, or the like. The probe S1 is connected to a processing and compensation field generator unit, which includes a unit 2 for calculating or correlating the values of the noise field inside the spatial volume V based on the noise field values detected by the probe S1 outside the spatial volume V. This unit 2 performs the calculation and/or correlation operations by using theoretical or empirical functions, i.e., deriving from the laws of electromagnetism and/or from experiments.

The calculation or correlation unit 2 may be a hardware unit which permanently incorporates mathematical functions in its circuits, by using widely known and used circuit components or units to execute the different mathematical operations on electric signals, or the unit 2 advantageously may comprise a programmable electronic unit, such as a microprocessor or the like, associated with a storage unit and provided in combination with different software programs for the execution of several functional steps.

Then, the signal output from the unit 2, which corresponds to a value of the noise field inside the spatial volume V is used to generate a compensation field. To this end, the unit 2 controls, by this signal, a compensation field generator 3, which substantially comprises a power supply or generator, which operates one or more coils B1 for generating the compensation field inside the spatial volume V, which coils are located in this volume V or in such a manner as to generate a compensation field which permeates this volume.

Again, the compensation field generator 3 may be a hardware board having a permanent construction, or a programmable and highly flexible unit. It shall be noted that these units, whose functions are described above, are widely used and known in the field of electronics and that those skilled in the art need only know the expected functional operations to easily determine the required components and the most appropriate selections, in response to specific needs.

The above device has a so-called open-loop structure, wherein a feedback loop is closed for compensation field control by applying the law, i.e. the calculation function which determines the inside magnetic field from outside measurements. This structure is particularly advantageous when the spatial volume V is the space wherein measuring devices whose operation is magnetic field dependent are accommodated, wherefor the presence of probes may affect operating conditions.

Here, the outside location of the probe S1 provides the greatest freedom in positioning the probe and in changing at will the number of probes in use.

Moreover, by using an open-loop configuration, magnetic compensation fields may be continuously changed. This is advantageous, for instance, in Magnetic Resonance imaging apparatuses, wherein the compensation device may operate during the imaging step, and correct noise fields in real time, while the correction loop is not affected by the magnetic fields required for Magnetic Resonance imaging nor the latter is affected by the former.

According to a first embodiment of this invention, which is clearly shown in FIG. 1, the device has frequency band definition means 4, which are used to detect and/or discriminate noise fields with different frequencies. In fact, as mentioned above, magnetic noise may be generated by several different types of sources and, depending on the latter, noise fields may have different frequencies. A first type of noise field is mainly determined by street traffic or the like, which generates noise fields with frequencies of the order of a few Hz. A second type includes magnetic fields generated by sources which use main Alternating Current, such as railways or tramways, or the like. In this case, noise fields have frequencies of the order of main AC frequency. Furthermore, electric sources may exist which use currents with frequencies corresponding to a rational fraction of the main AC current, which generate noise fields having frequencies of about 10 to 20 Hz. A practical analysis of noise fields leads in first approximation to two, or possibly three noise field types which have markedly different frequencies, and may be discriminated from each other and processed separately in an optimized manner. Further regarding magnetic field propagation laws, the two or three different types may differ due to the considerable difference between the generation sources associated to the corresponding noise fields.

From the above, multiple separate filtering means may be provided, as shown in FIG. 1, which denotes them with numeral 4, which means have each a different frequency passband, and may be successively connected to a single probe S1. Here, the probe S1 is connected to the different filters 4 by means of a switch which may be programmed or controlled by a suitably programmed processor. As an alternative to the above, a single programmable filtering circuit 4 may be provided, which is controlled by a microprocessor unit. A software program, loaded in the microprocessor would set the filtering circuit to the different frequency bands, in succession, for a predetermined time.

As a further alternative, which is shown in FIG. 1 by dashed lines, each frequency band may be associated with a respective probe S1, S2, S3, S4, S5. In this example, five frequency bands are provided, each with its own filter 4, connected to a corresponding probe S1, S2, S3, S4, S5. The output of each filter 4 is connected to noise field calculation means 2. Once more, regarding these calculation means 2 for determining the noise field inside the spatial volume V, separate electronic units may be provided for each frequency band being considered, i.e., for each filter 4, as shown in FIG. 1, or a single calculation unit 4 may be provided with different calculation programs being optimized, if needed, for the different frequency bands considered for noise fields, which unit determines the field inside the spatial volume by using the corresponding algorithm, in synchronism with the detection of the outside noise field within the corresponding frequency band.

Then, the data of the noise field inside the spatial volume V is transmitted to the means 3 which generate the compensation field exciting current.

Like the above units, the compensation field generator means 3 may themselves be separate for each frequency band in use, as shown in FIG. 1, particularly with reference to the frequency bands that are associated with the filters connected with the probes S1, S2, S3.

As an alternative thereto, the signal output from the inside noise field calculation means 2 may be transmitted to control a common compensation field exciting current generator unit 3, as shown in FIG. 1 for the frequency bands detected by the probes S4 and S5. In this case, the signal outputs from the calculation means 3 associated with the frequency bands 4 and 5 are combined to generate one compensation field exciting current which includes the noise field frequencies in the range of those two bands. This may be obviously obtained for all frequency bands being considered.

The currents which generate the different compensation fields, output from separate generator means 3 may be supplied to a single compensation field generator coil. Alternatively, each current may be used to feed individual coils for generating different compensation fields, which coils B1, B2, B3, B4 have an optimized construction for the corresponding frequency of the compensation fields that are to be generated thereby, as shown in FIG. 1 with reference to the outputs of the four excitation current generators 3 in use.

FIG. 1 also shows that different subsets of compensation field calculating and generating channels may be combined, and that the currents which generate the compensation fields for these channel subsets (see the channels of frequency bands 4 and 5) are supplied to a common magnetic field generator coil, as shown by the coil B4.

As an alternative to what is provided for the channels associated to the frequency bands 4 and 5, a combination may be also provided between the currents output from separate means for generating compensation field exciting currents to operate a single common magnetic field excitation coil, in lieu of a combination of the signals output from the calculation means to determine the noise field inside the spatial volume V as shown in FIG. 1 and as described above.

Because of the use of programmable means, e.g., programmable filters, programmable calculating units and/or programmable exciting current generator units, the device provides a higher versatility, as compared with the configuration of special hardware units, each dedicated to a frequency band. This allows the adjustment of operational options, e.g., channel combinations, number of channels, etc. in as relatively inexpensive manner.

Figure 2:
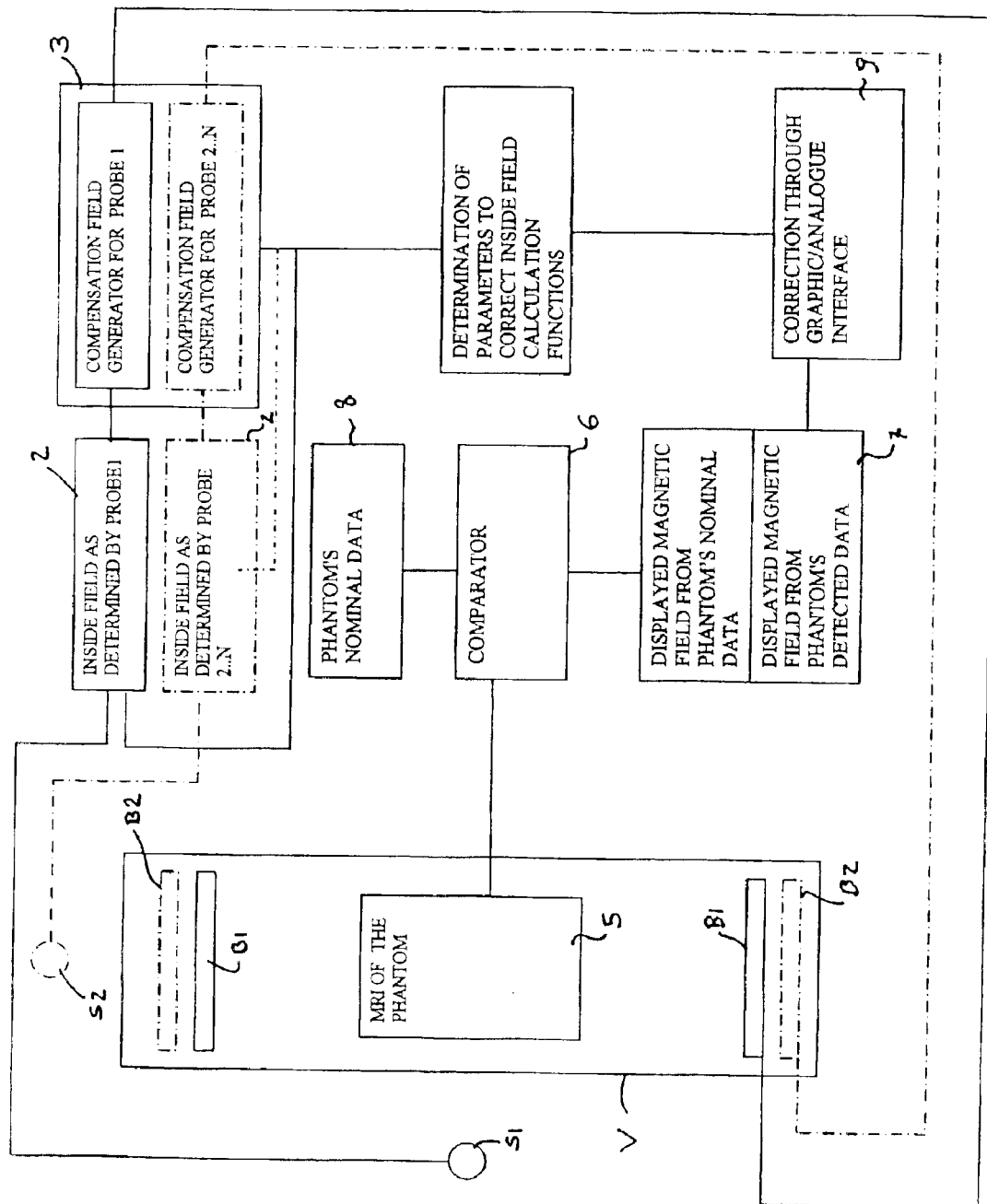
FIG. 2 shows a simplified block diagram of a device as shown in FIG. 1, which further comprises an active probe for measuring the noise field inside the spatial volume.

FIG. 2 shows another embodiment of a device as shown in FIG. 1. In this embodiment, a small number of probes is shown, the probe S2 being defined by a dashed line, which symbolically indicates the possibility of providing a greater number of probes and/or channels associated with different noise field detection frequency bands.

In FIG. 2, a probe or a device 5 for detecting the inside magnetic field is provided in the spatial volume V. The detecting probe or device 5 is connected at its output to a comparator 6, which is in turn connected with display means 7. Data input means 8 are further provided, which may be alphanumeric keyboard means and/or graphic means for graphically adjusting the displayed data.

According to a first operating mode, the detecting probe or device 5 inside the spatial volume V measures the actual noise field, and the latter is compared with the data of this field, resulting from the calculation, based on measurements of the outside magnetic field provided by the probe/s S1 and/or S2.

The comparator 6 compares the two field curves and displays them on screen, in overlapped and/or tiled and/or alternate positions, or displays the comparator output. In this case, the display means and the comparator allows highlighting of the differences between the calculated inside noise field, and the actual field, and to automatically adjust the parameters of the calculation functions, depending on the provision of one or more channels for the different frequency bands, so as to minimize or neutralize these differences and as to ensure that the compensation field exciting currents are generated on the basis of more accurate data on the noise fields inside the spatial volume V.

The display provides a visual representation of the automatic correction progress and/or allows manual interventions to the adjustment of the calculation function parameters by entering alphanumeric data through input means and/or by simply changing the graphic profile of the displayed field curve through graphic input means.

A unit for correlating graphic controls with the corresponding adjustments to calculation function parameters generates the controls to be transmitted to current generator/s for correcting the currents generated based on or directly by calculation means 2, to directly correct the parameters of the calculation functions executed thereby.

Figure 4:
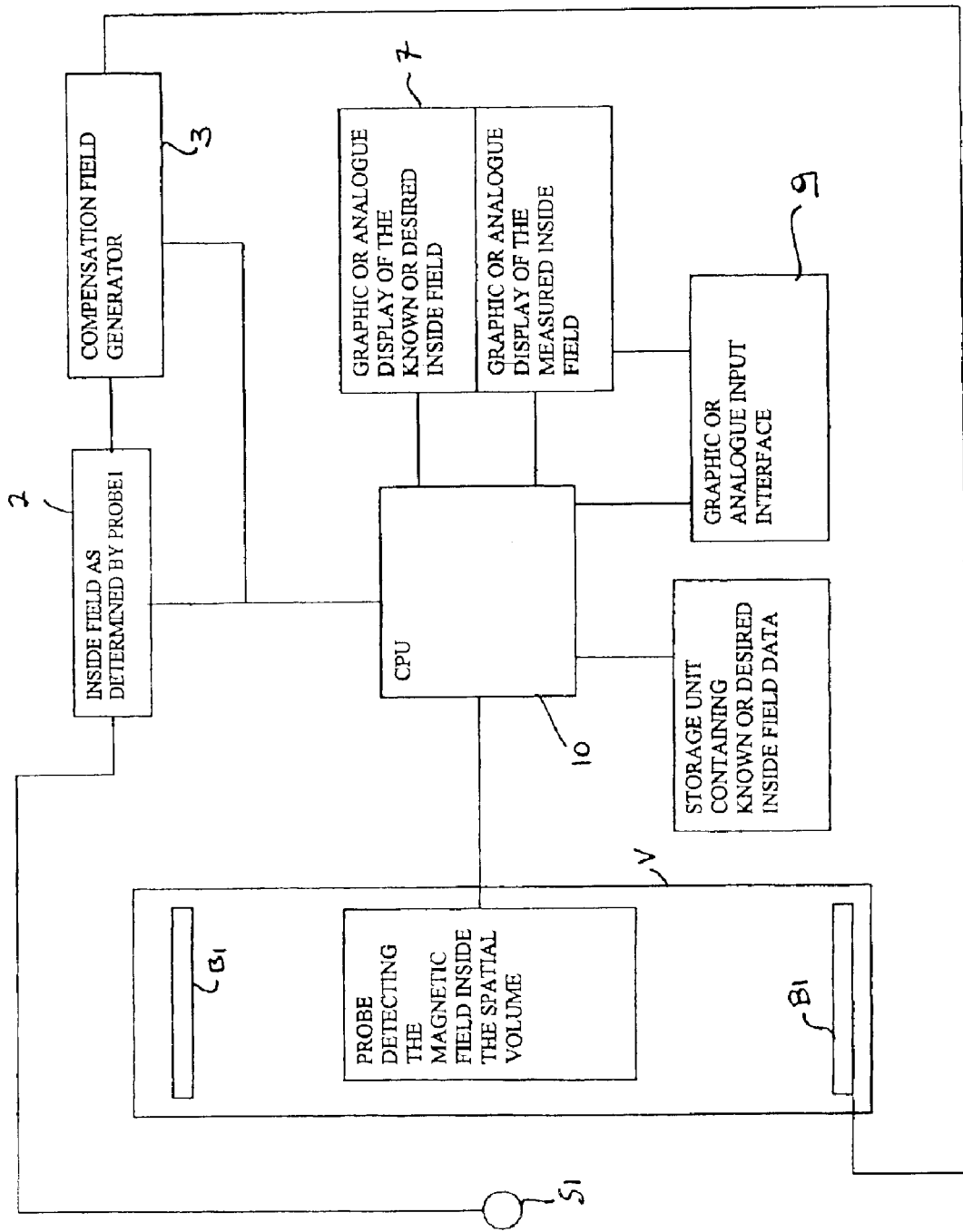
FIG. 4 shows a simplified block diagram of the device according to the previous Figures, having means for measuring the noise field inside the spatial volume and automatic or manual means for correcting the inside noise field calculation function and/or the currents for generating compensation fields for these inside noise fields.

FIG. 4 shows a variant embodiment of the embodiment of FIG. 2, wherein these functions are performed by a processing unit, which comprises a microprocessor or a computer, whose central processing unit 10 controls the computing means 2, the exciting current generator means 3, the display means 7, the comparator, which are all programmable and constitute either internal or peripheral units of the central processing unit.

Once more, the architecture of the device as shown in FIG. 4 allows a higher expansibility and flexibility relative to the number of probes and channels, and/or to the methods for executing the steps of noise field detection and calculation, of actual condition detection and comparison and/or execution of the above control procedures.

A variant embodiment, which is not shown in the Figures, replaces the detection probe inside the spatial volume V with a device for detecting compensation conditions, which operates on the basis of the changes to an active well-known static field, which is disposed inside the spatial volume V.

Here, there is no direct comparison between the inside noise fields determined from the measurements of the corresponding noise fields outside the spatial volume V, but the comparison is performed between the characteristics of the well-known static field as actually measured inside the spatial volume V and theoretically known characteristics.

Any type of device operating with the help of magnetic fields may be used for this purpose. Particularly, a suitable device for this purpose is a nuclear spin resonance echo detection device.

In this case, the device includes a so-called phantom, i.e., a test member having a known response to Magnetic Resonance stress. Inside the spatial volume V, the device 5 is used to excite and receive nuclear spin echoes from the phantom and to compare the data of said echoes with theoretical known data, which is stored in a suitable storage unit, as shown with numeral 8 in FIGS. 2 and 4.

From a first analysis, a simple comparison may be performed between the frequency of these detected nuclear spin echoes and the theoretically expected frequency thereof.

The curves of the actual static field may be determined from the received echo signals and compared with the theoretical field. As described above, here again, the corrections to calculation function parameters in calculation means 2 and/or to the currents for generating the compensation field/s may be determined by using either an automatic mode or a manual mode, by inputting alphanumeric data and/or graphic interventions, always with the purpose of minimizing or neutralizing the differences detected by the comparator.

The active static field device 5 may advantageously consist of a Magnetic Resonance imaging apparatus, which has the necessary means to excite, receive and process the nuclear spin echoes from a phantom and typically, in addition to the processing electronics, means for generating a static field, at least one coil for transmitting exciting pulses and at least a coil for receiving nuclear spin echoes. The combined use of a Magnetic Resonance imaging apparatus and a noise field compensation device may be particularly suitable to compensate for noise fields in the rooms wherein these apparatuses are located. As a rule, the apparatuses are inserted in Faraday cages which are housed in special rooms, which cages form the spatial volume V which typically contains a Magnetic Resonance imaging apparatus. Here, the probe/s S1, S2, S3, S4, S5 are located outside the Faraday cage.

This application is also advantageous for the fact that Magnetic Resonance imaging apparatuses generally have a programmable control and processing unit, which can accomplish some of the functions of the noise field compensation device, such as the functions of the calculation means 2, passband filters 4, compensation field exciting current generator means 3, comparator means 6 as well as displays 7, storage units 8, and alphanumeric and/or graphic input means 9. Hence, the above mentioned combined use of Magnetic Resonance imaging apparatuses and noise field compensation devices allows to drastically reduce fabrication costs for the device, which are limited to the probe/s S1, S2, S3, S4, S5 and to the compensation field generator coil/s.

According to another embodiment of the invention, which may be provided separately or in combination with the above embodiments, the device may have a plurality of probes S1, S2, S3 to Sn, associated with calculation means 2 and with compensation field exciting current generators 3, which probes are used to detect the same noise field (with reference to a possible discrimination into several frequency bands as described above) in several locations outside the spatial volume V, a system of equations being thereby generated, which allows to calculate all variable parameters some of them, i.e., the variable parameters that are particularly relevant, with reference to the desired approximation, for the law that describes the measured noise field. This provides more accurate calculation functions to determine the propagation of said noise field inside the spatial volume V, whereby more accurate compensation fields may be generated.

It shall be noted that the above structure provides various automation levels, which may range from automatic automation of the steps to correct the functions for correlation or calculation of noise fields inside the spatial volume V or compensation fields from the detection of these noise fields outside the volume, until full execution of the individual steps, based on individual manual controls or even individual manual operations. A hardware structure may be also provided which allows to set the automation level at will to always allow a manual intervention to partly or wholly complete or replace the automatic procedure.

The number of probes S1, S2, S3 to Sn in use depends on the number of the variable parameters to be determined, hence the number of equations required to solve the system of equations.

Figure 3:
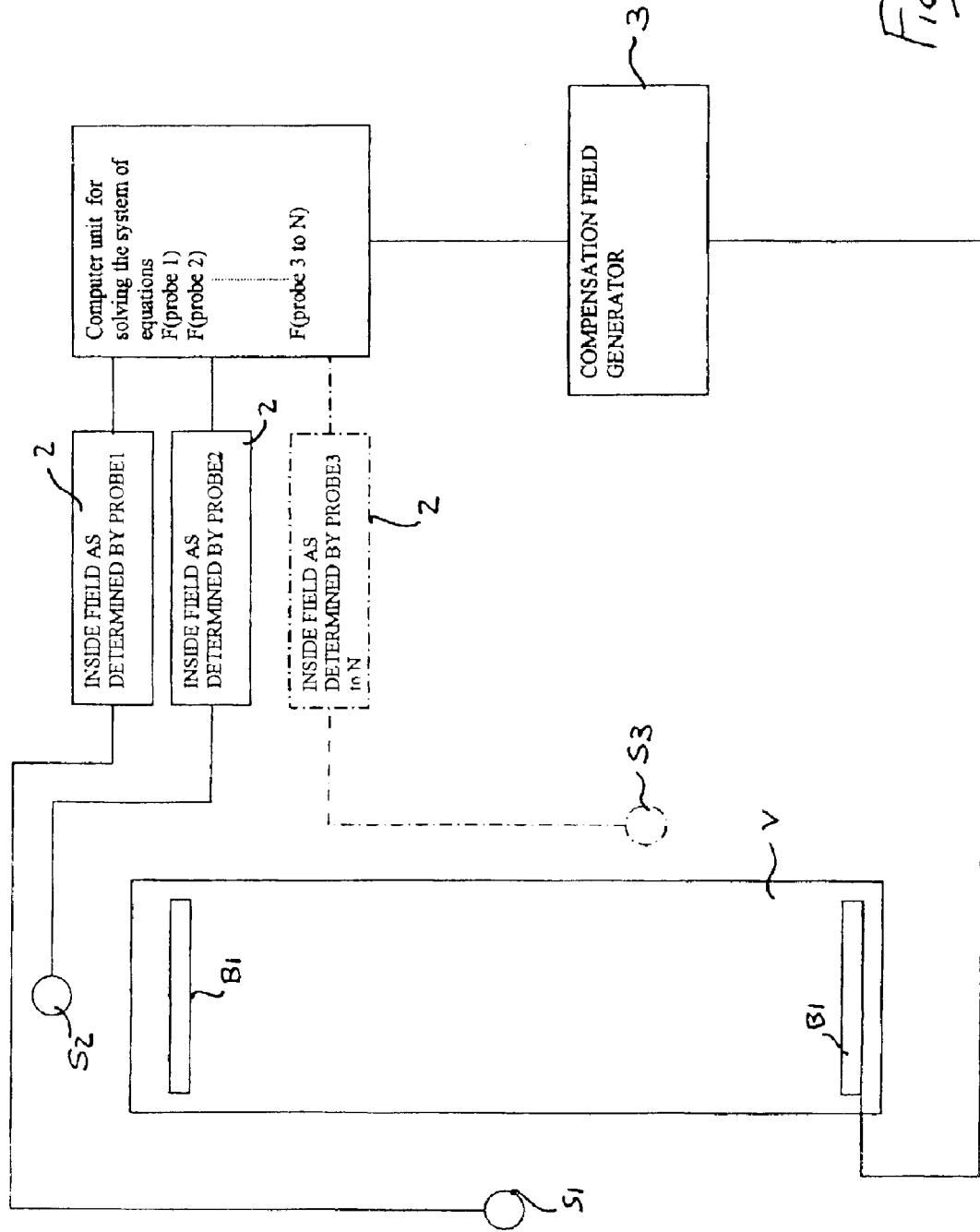
FIG. 3 shows a simplified block diagram of a variant embodiment of the device according to the previous Figures.

The above is schematically shown in FIG. 3. At least two probes S1, S2, and possibly multiple probes S3 are provided outside a spatial volume V. The measuring signals thereof are transmitted to the calculation means 2 which generate a system of two or three equations, which system is solved by a calculation unit. The calculation unit provides, at its output, the calculation function to determine the field inside the spatial volume V, hence to control the compensation field exciting current generators 3, the currents being fully defined with reference to the selected number of variable parameters.

An easily understandable example consists in the treatment of noise fields caused by dipoles, e.g., the noise fields generated by vehicles, or the like. Here, the dipole will have a definite orientation, i.e., parallel to the field lines of the earth's magnetic field, however the variable parameters are the strength and position of the dipole. By detecting the same magnetic noise field twice, at two different locations and with two probes, two equations may be obtained to describe the magnetic field, and to determine the two strength and position variables.

Hence, the number of probes is defined by the number of degrees of freedom of the noise field.

While FIG. 3 shows the steps of this method in the form of functional electronic units, the device for implementing the above method advantageously has programmable and CPU controllable operating units. In this case, the method need not be executed by a device different from the above, but only requires an appropriate control program to be loaded in the CPU storage.

Obviously, the above functions may be also integrated with expressly dedicated hardware, if desired. According to another embodiment which may be provided both separately and in combination with the above characteristics, the device may have means for detecting the static components of the noise fields.

In this case, the noise field is analyzed relative to the amplitude oscillation band, e.g., by peak detectors or by sampling and measuring the individual maximum and minimum amplitudes for a predetermined time. Then, the inside noise field, and the associated compensation field are determined. The current for exciting this compensation field is determined by subtracting from the actual compensation field the possible offset, or average value of the actual compensation field, so that substantially only the variable component of the noise fields is compensated for, since the offset component does not particularly introduce noise effects or image deformation in Magnetic Resonance imaging. In short, the above operation displaces the compensation field in such a manner that a graphic representation of the compensation field curve in time shows it as being substantially centered around a horizontal straight line, representing time, which passes through the zero field value. This allows to limit compensation to time-dependent noise field components, hence to reduce power consumption and construction costs for the device. This mode is especially advantageous in technical and examination applications of Magnetic Resonance apparatuses, wherein the quality of the final image is not affected by the static contribution of noise fields, whereas the oscillating, i.e., time-dependent components, cause blurring or distortion effects and/or artifact generation.

Finally, FIG. 5 shows a Magnetic Resonance imaging apparatus which integrates a device according to the invention, as described above.

FIG. 5 only shows an embodiment thereof, and the noise field compensation device that is integrated in the Magnetic Resonance imaging apparatus may have one or more of the above characteristics, with reference to combinations or sub-combinations thereof. Even regarding construction, the device integrated in the Magnetic Resonance imaging apparatus may have all the construction variants or alternatives as indicated above.

In this case, the spatial volume wherein the noise fields are to be compensated for coincides with the cavity of the Magnetic Resonance imaging apparatus which is to accommodate the patient body or a part thereof and is also indicated as V.

FIG. 5 describes a preferred embodiment which includes at least one probe S1 and allows the use of multiple probes as shown by the probes S2, S3, S4, S5, which are shown by dashed and dotted lines.

A dashed line and the numeral 11 denote the typical control and processing electronics of a Magnetic Resonance imaging apparatus, whereas the blocks included therein are additional functional units, or have functions accomplished by appropriately programmed or controlled units of the Magnetic Resonance imaging apparatus.

Referring to the noise fields that are relevant for Magnetic Resonance imaging apparatuses, two imaging and/or processing channels are provided, differing for the frequency bands that include the frequencies of the noise fields. Particularly, one of these bands includes values from less than one Hz to a few Hz, e.g. ½ to 9 Hz, particularly ½ to 3 Hz, and the other band has values from 10 to 60 Hz. The first band will be named low frequency band and the second high frequency band.

The Magnetic Resonance imaging apparatus includes means for generating a static magnetic field, which are denoted with numeral 12, e.g., two opposite poles of a magnetic structure, enclosing a cavity for accommodating the body under examination or a part thereof, which cavity includes, at the periphery of the area in which the body under examination or a part thereof is accommodated, at least one compensation coil 13, at least one exciting pulse transmission coil 14, at least one magnetic gradient generating coil 15 and at least one receiving coil 16. The Magnetic Resonance imaging apparatus obviously has, in its control and processing unit, all units to control and process the above coils for the ordinary operation of the apparatus.

The probe S1 and/or other possible probes S2, S3, S4, S5, S6 are connected to the input of means for calculating the noise field inside the cavity V of the Magnetic Resonance imaging apparatus from theoretical or empiric calculation functions, as described above regarding the simple noise field compensation device. Here, FIG. 5 shows in a single box the different calculation units of the embodiment of FIG. 1 and the corresponding filters 4. Similarly, these calculation units and filters may be associated with all variant embodiments as described above with reference to the compensation device only.

Particularly, advantages result from providing the calculation units 2 and/or the filters 4 in the form of software units, consisting of programs for controlling preexisting units of the Magnetic Resonance imaging apparatus, and particularly of the central processing and control unit, or possibly of the latter in combination with peripherals dedicated to perform filtering and/or calculation operations.

The signals of the noise field inside the cavity V are transmitted for each of the two low frequency and high frequency bands to means 3 for generating a compensation field exciting current. The currents that excite compensation fields for low-frequency and high-frequency noise fields are transmitted together with the currents 17 that operate the compensation coils 13, which are normally generated by the apparatus and are means to compensate for thermal drifts or static field variations that are due to other causes.

The compensation coils 13, already resident in the Magnetic Resonance imaging apparatus, are adapted to compensate for substantially uniform and homogeneous static field fluctuations, induced by outside magnetic fields, in the imaging cavity V. Nevertheless, some fluctuations may show some spatial variability within the cavity, i.e., spatial non-homogeneities.

In this case, by suitably controlling gradient coils 18, compensation fields may be also generated for these field fluctuations, induced by noise fields, which have nonuniformities and nonhomogeneities in space.

As described above, the Magnetic Resonance imaging apparatus already has means to operate as a device which generates an active test field to check the effectiveness and accuracy of noise field compensation, based on the comparison between the theoretical or normal characteristics of the static field, and the characteristics that may be actually obtained from the excitation and reception of nuclear spin echo signals.

To this end, a phantom F is used, which has a well-known response to excitation. The methods for adjusting the compensation field generation parameters, either in automatic or manual alphanumeric input mode and/or by graphically adjusting the actual curve of the actually measured static field, resulting from the excitation and reception of nuclear spin echo signals from the phantom are the same as described above, and the necessary control and processing units are denoted with the same numerals as in the previous Figures. Here, the storage unit of the control and processing unit of the Magnetic Resonance imaging apparatus contains the control and processing programs required for operating the existing operational units to implement these methods.

The apparatus may also execute the same method steps as described with reference to FIG. 3 to determine all the variables of the noise field describing functions by collecting different measures in different locations of the noise fields outside the spatial volume V (i.e., the cavity wherein the body under examination or a part thereof is accommodated) and of the functions for generating and solving a system of equations which describe this/these fields, the number of these equations, i.e., of these measurements corresponding to the number of these variables.

Even this function may be accomplished by the Magnetic Resonance imaging apparatus, by simply loading therein suitable software programs for controlling operational units, typically resident therein.

Obviously, in view of the integration of the Magnetic Resonance imaging apparatus with the noise field compensation device, a particular preference is awarded to the apparatuses in which the structure of the control and processing unit is much the same as a computer, i.e., a PC or the like, in which the different functions simply consist of corresponding control and processing programs, and in which only a few specific units, such as power amplifiers, filters or interfaces for sensors, probes or the like, are specifically constructed and connected to this control and processing computer.

Still with reference to the above noise field compensation device, described as separate from the Magnetic Resonance imaging apparatus, the integrated configuration further provides a mode in which compensation fields may be limited to the amplitude oscillating band only, which allows to avoid the compensation for the static part of these fields. In this case, the static part is only an offset which does not change with time, and hence does not contribute in generating operational problems in the apparatus or imaging artifacts.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A Magnetic Resonance imaging apparatus comprising a cavity for accommodating a body under examination or a part thereof, wherein the apparatus is integrated with a device for compensating for unwanted noise fields in said cavity, wherein the device includes:

means for determining a strength of a magnetic noise field outside said spatial volume;

means for defining on a theoretical basis or on an empirical basis, a correlation between the magnetic noise field outside the spatial volume and a corresponding noise field inside said spatial volume, or calculating the noise field inside the spatial volume, from the measurements of the magnetic noise field outside the spatial volume;

from the inside magnetic field, as determined theoretically or empirically, means for generating a magnetic compensation field for neutralizing the noise field in said spatial volume;

means for separately detecting magnetic noise fields outside the spatial volume with frequencies in the range of at least two or more different frequency bands; and means for generating one or more corresponding compensation fields for each, or at least some of the noise fields inside the spatial volumes with frequencies in the range of said at least two or more predetermined frequency bands.

2. A method for compensating for magnetic noise fields in a spatial volumes, comprising:

determining a strength of a magnetic noise field outside said spatial volume;

defining on a theoretical basis or on an empirical basis, a correlation between the magnetic noise field outside the spatial volume and a corresponding noise field inside said spatial volume, or calculating the noise field inside the spatial volume, from the measurements of the magnetic noise field outside the spatial volume;

from the inside magnetic field, as determined theoretically or empirically, generating a magnetic compensation field for neutralizing the noise field in said spatial volume;

separately detecting magnetic noise fields outside the spatial volume with frequencies in the range of at least two or more different frequency bands; and generating one or more corresponding compensation fields for each, or at least some of the noise fields inside the spatial volumes with frequencies in the range of said at least two or more predetermined frequency bands.

3. The method as claimed in claim 2, wherein at least some of the noise fields with frequencies in the range of the at least two or more frequency bands use the same correlation law to correlate the parameters of the outside noise fields to the inside noise fields, or the same correlation law to calculate the noise magnetic fields inside the spatial volume, based on the measurements of the noise fields outside the spatial volume or the same means for generating the corresponding compensation fields for at least some of the noise magnetic fields with frequencies in the range of the at least two or more different frequency bands.

4. The method as claimed in claim 2, wherein correlation laws are provided to correlate the magnetic noise fields detected outside the spatial volume and the corresponding magnetic noise fields inside the spatial volume, and that calculation laws are provided to calculate the latter fields, on the basis of the measurement of the noise fields outside the spatial volume, which are different for at least some or all of the magnetic noise fields with frequencies in the range of the at least two, three or more different frequency bands being used to discriminate the different magnetic noise field types.

5. The method as claimed in claim 2, further comprising generating magnetic compensation fields which are different for all or at least some of the at least two or more frequency bands that are used to discriminate the different noise field types.

6. The method as claimed in claim 2, further comprising using one common detection probe for detecting the noise fields with frequencies in the range of all or at least some of the at least two or more frequency bands.

7. The method as claimed in claim 2, further comprising providing selective generation of compensation fields for any noise field frequency by optimizing noise field detection, the correlation law to correlate the noise fields detected outside the spatial volume and the noise fields inside it, or the calculation laws to calculate the latter from the measurements of the outside noise fields, and compensation field generation.

8. A method as claimed in claim 2, further comprising the steps of defining the degrees of freedom, i.e., the variable parameters of the individual noise fields, and of measuring the noise fields at a number of different locations, outside the spatial volume, which number corresponds to the number of degrees of freedom or variable parameters, a system of equations being generated on the basis of these different measurements, which equations have a number of functions for correlation with the field inside the spatial volume, or for calculation of said inside field or for description of the noise field curve, which number is equal to that of the measurements, and whose solution allows to determine all the variable parameters of the magnetic noise field and of the functions for describing it and/or for correlating the noise field inside the spatial volume and/or of the functions for calculating said noise field inside the spatial volume.

9. The method as claimed in claim 8, wherein two or more measurements made at different locations outside the spatial volume are repeated for all or at least some of the magnetic noise fields having frequencies in the range of said at least two or more predetermined frequency bands.

10. The method as claimed in claim 2, wherein alternatively thereto, or in combination therewith, it includes the steps of determining the functions for correlation between the noise fields outside the spatial volume and the noise fields inside it, or the functions for calculation of inside noise fields based on the measurements of the outside noise fields and/or of determining the noise field describing functions and/or of determining compensation fields by control measurements of magnetic fields inside the spatial volume.

11. A method as claimed in claim 10, wherein it includes the steps of measuring the noise field/s inside the spatial volume, comparing the measured inside noise fields with that/those determined on the basis of the measurements of noise fields outside the spatial volume, adjusting the variable parameters of said functions for calculating or describing the magnetic fields inside the spatial volume and/or the compensation fields, with the purpose of minimizing or neutralizing the differences as determined during the comparison.

12. A method as claimed in claim 10, wherein it includes the generation of a known static test field inside the spatial volume, and the detection of the actual characteristics of said test field, while said characteristics are compared with the well-known characteristics of said static test field, the variable parameters of said inside field and/or compensation field calculating or describing functions being adjusted to minimize or neutralize the differences resulting from the comparison between measured characteristics and well-known characteristics of the static test field.

13. A method as claimed in claim 12, wherein it includes the following steps:
generating a static magnetic field in the spatial volume, which magnetic field has such a strength and homogeneity as to be suitable for Magnetic Resonance imaging;
introducing a phantom in said static magnetic field, whose response to nuclear spin echo excitation is known;
exciting nuclear spin echoes in said phantom, by transmitting exciting pulses thereto;
receiving nuclear spin echoes from said phantom when fields are provided for compensating for the noise fields in the spatial volume; and
comparing received data with well-known data or the characteristics of the static test field as determined from received signals with known characteristics;
adjusting the parameters of the functions that are used to calculate or correlate noise fields outside the spatial volume and noise field/s inside the spatial volume, or the parameters of noise field or compensation field describing functions, on the basis of the differences resulting from the above comparison, and in such a manner as to neutralize or minimize said differences.

14. The method as claimed in claim 10, wherein the adjustment of the parameters of inside noise field and/or compensation field describing or calculating functions is determined manually, by alphanumeric data input and/or by controls designed to graphically change the comparison results.

15. The method as claimed in claim 10, wherein the adjustment of the parameters of inside noise field and/or compensation field describing or calculating functions is determined automatically.

16. The method as claimed in claims 10, wherein in the first approximation the frequency response of nuclear spin echoes is analyzed, and the discrepancy between the detected frequency and the theoretical well-known phantom frequency response is used to adjust the parameters of inside noise field correlation or calculation functions, and/or noise field and/or compensation field describing functions, particularly, the gain of compensation field generators.

17. The method as claimed in claim 10, wherein the comparison results are displayed in graphic form on a monitor, graphic means being provided to change the displayed representation, which means automatically generate controls for correcting the parameters of inside noise field calculation or correlation functions, and/or noise field and/or compensation field describing functions, corresponding to graphic changes.

18. The method as claimed in claim 10, wherein the steps of determining the functions for correlation between the noise fields outside the spatial volume and the noise fields inside it, or the functions for calculation of inside noise field/s based on the measurements of the outside noise fields and/or of determining the noise field describing functions and/or of determining compensation fields by control measurements of magnetic fields inside the spatial volume are executed separately for each or at least some of the predetermined at least two, three or more predetermined frequency bands being used to discriminate noise magnetic fields.

19. The method as claimed in claim 2, wherein it includes the following steps:
performing multiple noise field detections in time;
determining, in a given time, the maximum and minimum values of the noise field curve;
determining the compensation field from the noise field as measured according to the above, by subtracting therefrom the offset or average detected noise field value; and
generating the compensation field for said noise field, wherefrom the offset or average detected noise field value is subtracted.

20. The method for compensating for noise fields in spatial volumes containing a Magnetic Resonance imaging apparatus, as claimed in claim 2, wherein it includes the detection of noise fields outside the room containing the Magnetic Resonance imaging apparatus, and the use of the control and processing units of the Magnetic Resonance imaging apparatus to execute the procedures of reading measures, and/or calculating inside noise fields and/or defining the at least two or more predetermined frequency bands and/or generating compensation field exciting currents, there being provided one or more coils for generating compensation fields inside the room wherein the Magnetic Resonance imaging apparatus is located and programs for controlling control and processing units of the Magnetic Resonance imaging apparatus to execute the steps of the noise field compensation method as claimed in claim 2.

21. The method as claimed in claim 2, wherein the spatial volume wherein noise fields are compensated for, is the cavity which houses the body under examination, or a part thereof, of the Magnetic Resonance imaging apparatus.

22. The method as claimed in claim 20, wherein the Magnetic Resonance imaging apparatus is also a device for measuring magnetic fields in the spatial volume to execute the steps of the method as claimed in claim 9, the display and control input units and the units for controlling and processing the Magnetic Resonance imaging apparatus, being controlled by programs loaded for executing said steps as claimed in claim 10.

23. The method as claimed in claim 2, wherein it compensates for peaks or fast variations of noise fields, which are modified by the currents generated in the electrically conductive structures around the magnetic cavity, the curve of said noise fields being equated to exponential field curve functions, which are used to calculate the inverse exponential compensation field curve functions, hence the currents for generating compensation fields for fast transients of the noise field, which currents may be superimposed on or combined with the currents for generating compensation fields for noise fields having variations in one or more low-frequency bands.

24. The device for compensating for magnetic noise fields in a spatial volume and for implementing the method as claimed in claim 2, which includes:
at least one noise field detecting probe, which probe or probes are disposed outside a spatial volume;
at least one unit for determining the magnetic noise fields inside the spatial volume, on the basis of the data detected by the probe or probes;
at least one unit for generating the magnetic compensation fields for the noise fields inside the spatial volume; and
means for defining at least one separating frequency to discriminate at least two bands of noise fields.

25. The device as claimed in claim 24, wherein it includes a set of filters, whose passband is such as to divide a frequency range into at least two different frequency bands or into three or more frequency bands.

26. The device as claimed in claim 24, wherein separate and different means for determining the magnetic noise fields inside the volume, operating with at least partly different functions, are provided for all or some frequency bands of the magnetic noise fields or for subsets of frequency bands.

27. The device as claimed in claim 24, wherein alternatively to or in combination with the above, separate and different means for generating compensation fields are provided for each frequency band or for subsets of frequency bands.

28. The device as claimed in claim 24, wherein it has a single probe outside the spatial volume, which is connected to a single computer unit for determining the noise field inside the spatial volume and to a single unit for generating the compensation field.

29. The device as claimed in claim 24, wherein it has a single probe outside the spatial volume, which is connected to a single computer unit for determining the noise field inside the spatial volume, said computer unit being connected to a plurality of generator units for generating compensation fields, all or some of the latter being associated to one of the at least two or more predetermined noise field frequency bands, the probes being used in succession for detecting noise fields with frequencies in the range of the at least two or more predetermined frequency bands, there being provided variable passband filtering means, or different filters with different passbands, for alternate connection to the probes, and the computer unit for determining the noise fields inside the spatial volume being programmable and provided with a storage unit containing the different functions for calculation of noise fields inside the spatial volume, on the basis of the noise fields detected by the probes outside the spatial volume, and for correlation between the noise fields outside the spatial volume and the corresponding fields inside the spatial volume, whereas the algorithms of said calculation and correlation functions to determine and correlate magnetic fields inside the spatial volume, corresponding to all or some of the passbands of the filter are loaded and executed in the working storage, in synchronism with the detection of outside noise fields in the range of a corresponding band among said frequency bands, whereas the inside noise field data as determined thereby is transmitted to a compensation field generator, dedicated to the corresponding frequency band.

30. The device as claimed in claim 24, wherein it has multiple permanent probes, each dedicated to the detection of noise fields outside the spatial volume, with frequencies in the range of one of the predetermined frequency bands or a subset of the predetermined frequency bands, a unit for calculation or correlation of inside noise fields for each predetermined frequency band or subset of predetermined frequency bands, as well as a compensation field generator unit for each frequency band or each subset of frequency bands.

31. The device as claimed in claim 24, wherein the compensation field generating units include an electronic unit which generates a current to operate one or more magnetic field generating coils, such as solenoids or the like, although a single compensation field generating coil may be provided, which is or may be connected to all or some of the different units for generating compensation field exciting currents for the noise fields with frequencies in the range of the at least two, three or more predetermined frequency bands.

32. The device as claimed in claim 24, wherein the compensation field generating units include an electronic unit which generates a current to operate one or more magnetic field generating coils, such as solenoids or the like, although a compensation field generating coil is provided, for all units for generating compensation field exciting currents or for subsets thereof, which coil is separate and associated to at least one of the at least two, three or more predetermined frequency bands, or to a subset of said at least two, three or more frequency bands.

33. The device as claimed in claim 24, wherein it has at least two or more probes, positioned outside the spatial volume in different locations, and each designed to detect the noise field outside said spatial volume at the different probe locations, with frequencies in the range of at least one frequency band of the at least two, three or more predetermined bands, an algorithm being loaded in the computer and correlation unit, for generating and solving a field describing system of equations, each equation consisting of the calculation or correlation function and of a noise field describing function applied to the data detected by one of said at least two, three or more probes, which solution of the system of equations provides all the noise field describing variable parameters.

34. The device as claimed in claim 33, wherein it includes a programmable processing unit, containing the programs for solving the systems of equations.

35. The device as claimed in claim 33, wherein it includes a number of measuring probes which corresponds to the number of independent variable parameters of the noise field describing function.

36. The device as claimed in claim 24, wherein it has at least one probe or device which measures the field inside the spatial volume, there being provided means for comparing the noise fields inside the spatial volume which are obtained by a calculation based on measured outside fields, and the fields inside the spatial volume which are measured by the internal probes or device, as well as means for manually adjusting the parameters of the calculation and correlation functions and/or of compensation fields, to minimize the differences between the calculated inside fields and the actually measured inside fields.

37. The device as claimed in claim 36, wherein the probes or devices situated inside the spatial volume are active probes or devices, i.e., generate a predetermined test field, whose characteristics are well-known and predetermined in a no-noise condition, while the comparator receives the measures of said test field inside the spatial volume and the nominal known values of said test field and there being provided means for manually adjusting the parameters of the calculation, correlation, noise field description and compensation field generation functions to minimize or neutralize the differences between the known test field data and actual test field measurement data.

38. The device as claimed in claim 36, wherein a device for exciting and detecting Magnetic Resonance echoes in a predetermined phantom is used as an inside field detection device.

39. The device as claimed in claim 38, wherein the device for detecting the field inside the spatial volume includes means for generating a static field inside a predetermined volume, a coil for transmitting nuclear spin exciting pulses, a coil for receiving echoes from said nuclear spins, and a phantom having well-known response characteristics related to said Magnetic Resonance echoes, means for determining the frequency of said Magnetic Resonance echoes and means for comparing said Magnetic resonance echo frequency with the well-known frequency, means for adjusting the parameters of the calculation or correlation function/s and/or of noise field describing functions and/or of the compensation field generators, to minimize or neutralize the difference resulting from the comparator output.

40. The device as claimed in claim 24, wherein it includes means for processing the actual static field characteristics from the received echo signals, actual data being compared with well-known nominal data in the comparator.

41. The device as claimed in claim 40, wherein it has means for determining the static test field distribution in time, on the basis of the frequency of Magnetic Resonance echo signals.

42. The device as claimed in claim 24, wherein means are provided for automatically making adjustments to the parameters of calculation or correlation functions and/or of compensation field exciting current generation, consisting of a feedback unit, which adjusts the parameters of calculation or correlation functions and/or the noise field describing function, and/or the characteristics of the compensation field generating current on the basis of the difference signal resulting from the comparator and with the purpose of minimizing or neutralizing said differences.

43. The device as claimed in claim 24, wherein manual adjustment means may be alternatively or jointly provided i.e., control input means for adjusting the parameters of the calculation or correlation functions and/or the compensation field generating currents.

44. The device as claimed in claim 24, wherein it has means for displaying the parameters or the curve of the test field and/or the outside noise fields and/or both theoretical or known and actual or measured inside fields, which means display said data in alternate, overlapped and/or tiled form, graphic interface means of graphic input means through which controls are input, which change the aspect of the magnetic fields and/or the parameters thereof and means for univocal association of an adjustment to the parameters of the calculation and correlation functions and/or to the compensation field generating currents in response to the selected graphic changes.

45. The device as claimed in claim 24, wherein the means and units of the device may be units with a dedicated construction or computers, as well as small suitably programmed PCs, having interfaces for connection with the outside noise field and/or inside noise field measuring probes, and with the compensation field generating coils and/or with the test field generating and measuring devices, while the software for executing probe signal reading functions, and/or the algorithms for determining the calculation and correlation functions to determine inside noise fields, the algorithms for determining current generating functions to create compensation field generating currents, the algorithms for executing comparison functions, functions for automatic determination or manual setting of adjustments to the parameters of calculation and correlation functions and/or to compensation field exciting current generation functions, as well as the software for displaying and controlling the alphanumeric and graphic manual data input interfaces is loaded, in any combination or subcombination, in said computer or PC.

46. The device as claimed in claim 24, wherein it includes means for determining, in a given time, the maximum and minimum values of the noise field curve; means for setting said time; means for determining the average value, or offset, of the noise field, and means for subtracting said offset or average value of the noise field curve from the latter, as well as means for generating the compensation field from said noise field curve after subtraction of the offset or average value therefrom.

47. The device as claimed in claim 24, wherein it is provided in combination with a Magnetic Resonance imaging apparatus, which is contained in a delimited space, that forms the spatial volume, wherein the noise fields are to be compensated for, at least some of the operating units of the Magnetic Resonance apparatus being used to execute at least some of the functions of the device as claimed in claim 23, in combination with control programs, that may be loaded in the control and processing unit of said Magnetic Resonance imaging apparatus.

48. The device as claimed in claim 24, wherein a Magnetic Resonance apparatus is used as an internal probe for detecting the conditions of the magnetic field inside said space based on the changes made to a well-known static field.

49. The device as claimed in claim 24, wherein the graphic processing and display section of the Magnetic Resonance imaging apparatus is used as a graphic processing and display unit to display the curve of the test magnetic field as obtained by actual measurement, and that associated to known and predetermined characteristics, and to make appropriate adjustments aimed at minimizing or neutralizing the differences between the actual test field and the test field having those known and predetermined characteristics, i.e., the nominal test field.

50. A device for compensating for magnetic noise fields in a spatial volume and for implementing the method as claimed in claim 2, which includes:

at least one noise field detecting probe, which probes are disposed outside a spatial volume;

at least one unit for determining the magnetic noise fields inside the spatial volume on the basis of empirically defined or theoretically electroydynamics-based calculation or correlation functions;

at least one unit for generating the magnetic compensation fields for the noise fields inside the spatial volume; and means for defining at least one separating frequency to discriminate at least two bands of noise fields.

51. A Magnetic Resonance imaging apparatus comprising a cavity for accommodating a body under examination or a part thereof, wherein the apparatus is integrated with a device for compensating for unwanted noise fields in said cavity, wherein the device is adapted to:

determine a strength of a magnetic noise field outside said spatial volume;

define on a theoretical basis or on an empirical basis, a correlation between the magnetic noise field outside the spatial volume and a corresponding noise field inside said spatial volume, or calculating the noise field inside the spatial volume, from the measurements of the magnetic noise field outside the spatial volume;

from the inside magnetic field, as determined theoretically or empirically, generate a magnetic compensation field for neutralizing the noise field in said spatial volume;

separately detect magnetic noise fields outside the spatial volume with frequencies in the range of at least two or more different frequency bands; and generate one or more corresponding compensation fields for each, or at least some of the noise fields inside the spatial volumes with frequencies in the range of said at least two or more predetermined frequency bands.

52. A magnetic Resonance imaging apparatus comprising a cavity for accommodating a body under examination or a part thereof, wherein the apparatus is integrated with a device for compensating for unwanted noise fields in said cavity, wherein the device for compensating for noise fields inside the cavity which accommodates the body under examination or the part thereof has:

at least one noise field detecting probe, which probe or probes are disposed outside a spatial volume;

at least one unit for determining the magnetic noise fields inside the spatial volume, on the basis of the data detected by the probe or probes;

at least one unit for generating the magnetic compensation fields for the noise fields inside the spatial volume; and means for defining at least one separating frequency to discriminate at least two bands of noise fields.

53. A Magnetic Resonance imaging apparatus comprising a cavity for accommodating a body under examination or a part thereof, wherein the apparatus is integrated with a device for compensating for unwanted noise fields in said cavity; wherein the apparatus has a cavity for accommodating a body under examination or a part thereof, means for generating a static field which permeates said cavity, at least one exciting pulse transmitting coil, at least one nuclear spin echo receiving coil, at least one static field compensation coil and at least one gradient coil, and there being provided an electronic apparatus controlling unit to operate the transmitting coil, the compensation coil and the gradient coils and which receives nuclear spin echo signals from the receiving coil, processes them and displays the corresponding images, which apparatus has, integrated therewith, a device for compensating for noise fields inside the cavity which accommodates the body under examination or a part thereof, there being provided at least one probe for detecting said noise fields inside said cavity, means for determining said noise fields inside said cavity on the basis of outside measurements, by theoretically or empirically defined calculation or correlation or noise field describing functions, means for generating compensation fields for the noise fields inside said cavity.

54. The apparatus as claimed in claim 53, wherein the means for determining said noise fields inside said cavity on the basis of outside measurements, by theoretically or empirically defined calculation or correlation or noise field describing functions, and said means for generating compensation fields for the noise fields inside said cavity are separate units, different from the specific control and processing units of the Magnetic Resonance imaging apparatus, or some or all of them are existing units of the Nuclear Magnetic imaging apparatus, in combination with specific control programs to operate the units of the Magnetic Resonance imaging apparatus, like said means for determining said noise fields inside said cavity and/or said means for generating compensation fields for the noise fields inside said cavity.

55. The apparatus as claimed in claim 54, wherein the compensation field generator means include the compensation coils and/or the gradient coils.

56. The apparatus as claimed in claim 51, wherein it has a programmable control and processing unit and all the means of the noise field compensation device are the electronic units of the Magnetic Resonance imaging apparatus, in combination with software for executing noise field and compensation field measurement and determination functions.

57. The apparatus as claimed in claim 51, wherein it has an input for at least one probe, preferably for at least two or more probes for detecting fields outside the cavity which accommodates the body under examination, and units for interfacing said probes with the control and processing unit of the apparatus, while a program for executing the compensation procedure is loaded, which determines, by using preset calculation and correlation functions, the noise field inside the cavity and the current for exciting the compensation coil and/or gradient coil, to be superimposed on the currents for generating normal compensation and/or gradient fields to obtain noise field compensation fields.

58. A Magnetic Resonance imaging apparatus comprising a cavity for accommodating a body under examination or a part thereof, wherein the apparatus is integrated with a device for compensating for unwanted noise fields in said cavity; wherein the apparatus has an interface for connection with one or more probes, which interface has means for setting frequency thresholds, to determine at least two different frequency bands of noise fields or filters having a passband that may be or is set on different frequency bands for separate measurement of noise fields having different frequencies.

59. The apparatus as claimed in claim 51, wherein it has individual hardware units or specific software programs loaded in the control and processing unit thereof, separate computer units for determining noise fields inside the cavity, by using optimized calculation or correlation functions for each frequency band of the at least two frequency bands being used.

60. The apparatus as claimed in claim 51, wherein it has individual hardware units or specific software programs loaded in the control and processing unit thereof, separate generator units for generating compensation fields for the noise fields inside the cavity for each frequency band of the at least two frequency bands being used.

61. The apparatus as claimed in claim 51, wherein the separate units for generating the compensation fields for the noise fields inside the cavity for each frequency band of the at least two frequency bands being used consist of a single generator unit which generates currents for exciting a single compensation coil, or of multiple separate generator units for each frequency band in use, which operate compensation field generating coils, individually or in separate sets.

62. A Magnetic Resonance imaging apparatus comprising a cavity for accommodating a body under examination or a part thereof, wherein the apparatus is integrated with a device for compensating for unwanted noise fields in said cavity; wherein the generator units, which generate currents for exciting substantially homogeneous or uniform compensation fields, at least inside the imaging cavity, operate static field compensation coils of the Magnetic Resonance imaging apparatus, whereas generator units are provided to compensate for non homogeneous or non uniform noise fields in said imaging cavity, which operate the gradient coils or adjust gradient coil exciting currents to generate compensation fields for said non homogeneous or non uniform noise fields.

63. A Magnetic Resonance imaging apparatus comprising a cavity for accommodating a body under examination or a part thereof, wherein the apparatus is integrated with a device for compensating for unwanted noise fields in said cavity; wherein the apparatus has means for measuring the actual magnetic field inside the cavity, which comprise the static field generators, the exciting pulse transmitting coils, the nuclear spin echo receiving coils, as well as the control and processing unit of the apparatus itself, there being provided a phantom to be accommodated in the cavity of the apparatus and a software program for measuring the actual field in the cavity, which program is loaded in and may be executed by the control and processing unit, and includes the steps of transmitting exciting pulses to the phantom in the cavity, receiving nuclear spin echoes from the phantom, determining the field curve inside the cavity from the received echoes, and comparing the received echo frequency or the actual inside field curve with the nominally or theoretically expected echo frequency or with the nominal or theoretically expected static field curve.

64. The apparatus as claimed in claim 63, wherein it includes dedicated hardware units or software programs loaded in the control and processing unit for automatic or manual processing of correction signals to correct the inside noise field calculation functions on the basis of the detections performed by the probes outside the cavity and/or to correct the compensation fields exciting currents.

65. The apparatus as claimed in claim 64, wherein it has means for graphically displaying the curve of the measured field and of the known field, and manual input means to input correction parameters either alphanumerically and through graphic devices for adjusting the actual curve of the displayed field, which parameters are interpreted by the apparatus and transformed into appropriate control signals, there being provided dedicated hardware units or suitable software programs in the control and processing unit of the apparatus.

66. A Magnetic Resonance imaging apparatus comprising a cavity for accommodating a body under examination or a part thereof, wherein the apparatus is integrated with a device for compensating for unwanted noise fields in said cavity; wherein the apparatus includes means for determining, in a given time, maximum and minimum values of the noise field curve; means for setting said time; means for determining the average value, or offset, of the noise field, and means for subtracting said offset or average value of the noise field curve from the latter, as well as means for generating the compensation field from said noise field curve after subtraction of the offset or average value therefrom.

67. A Magnetic Resonance imaging method which, in addition to steps of Magnetic Resonance imaging and image reconstruction from imaging data, includes the following steps:

measuring noise fields before executing imaging steps;

calculating compensation fields and exciting currents before executing imaging steps;

generating compensation fields during the whole Magnetic Resonance imaging time;

performing a succession or Magnetic Resonance imaging scans; and interposing, between each sequence of imaging steps and the previous one, a step in which the actual magnetic field is measured inside the imaging cavity, and the correlation or calculation functions for the outside noise field and the inside noise field are corrected, and/or the compensation field for the inside noise field is generated.

68. The method as claimed in claim 67, wherein a compensation check step is executed at the end of the Magnetic Resonance imaging sequence.

69. The method as claimed in claim 67, wherein a step for checking and correcting noise field compensation is provided alternatively to or in combination with other compensation field checking or correction step, even immediately before or after compensation field generation.

70. A Magnetic Resonance imaging method which, in addition to steps of Magnetic Resonance imaging and image reconstruction from imaging data, includes the following steps:

measuring noise fields before executing imaging steps;

calculating compensation fields and exciting currents before executing imaging steps;

generating compensation fields during the whole Magnetic Resonance imaging time;

setting parameters for correlation or calculation of noise fields inside the imaging cavity, based on the noise fields detected outside said cavity;

measuring the actual magnetic field inside the cavity while the compensation fields are active, and correcting the correlation or calculation functions for the noise field inside the cavity and the compensation fields, based on the comparison between the nominal and/or theoretical value of the inside field and the actual field obtained by said measurement, immediately before the imaging steps;

activating the compensation fields based on outside noise field measurements and on the inside field correlation or calculation functions as corrected during the preceding step;

executing substantially simultaneous nuclear spin echo signal excitation and detection steps in compliance with Magnetic Resonance imaging modes; and reconstructing images from these received signals.

71. The method as claimed in claim 70, wherein the noise field compensation and imaging steps may be repeated.

72. The method as claimed in claim 70, wherein in combination with the above steps, an additional measurement step may be provided to determine the actual in-cavity field, when the compensation fields are active and the inside noise field correlation or computation functions have been corrected and/or the compensation field is generated by comparing the actual measured value and the nominal, theoretical value of this in-cavity field, even when the Magnetic Resonance imaging steps have been executed.

* * * * *